(12) United States Patent
Jang et al.

(10) Patent No.: US 9,425,329 B2
(45) Date of Patent: Aug. 23, 2016

(54) RECTIFYING DEVICE AND METHOD FOR MANUFACTURING THE SAME

(71) Applicant: DAEGU GYEONGBUK INSTITUTE OF SCIENCE & TECHNOLOGY, Daegu (KR)

(72) Inventors: Jae Eun Jang, Daegu (KR); Jeong Hee Shin, Seosan-si (KR)

(73) Assignee: Daegu Gyeongbuk Institute of Science & Technology, Daejeon (KR)

( * ) Notice: Subject to any disclaimer, the term of this patent is extended or adjusted under 35 U.S.C. 154(b) by 22 days.

(21) Appl. No.: 14/281,281

(22) Filed: May 19, 2014

(65) Prior Publication Data

US 2014/0346558 A1    Nov. 27, 2014

(30) Foreign Application Priority Data

May 21, 2013    (KR) .................. 10-2013-0057073

(51) Int. Cl.
| | | |
|---|---|---|
| *H01L 29/88* | (2006.01) | |
| *H01L 29/06* | (2006.01) | |
| *H01L 29/66* | (2006.01) | |
| *H01L 29/861* | (2006.01) | |
| *H01L 29/16* | (2006.01) | |

(52) U.S. Cl.
CPC ............ *H01L 29/88* (2013.01); *H01L 29/0676* (2013.01); *H01L 29/1606* (2013.01); *H01L 29/6609* (2013.01); *H01L 29/66151* (2013.01); *H01L 29/861* (2013.01)

(58) Field of Classification Search
CPC .. H01L 29/861; H01L 29/872; H01L 29/0619
See application file for complete search history.

(56) References Cited

U.S. PATENT DOCUMENTS

| | | | |
|---|---|---|---|
| 5,541,422 A | | 7/1996 | Wolf et al. |
| 7,342,292 B2 * | | 3/2008 | Schrenk ...................... 257/532 |
| 8,049,203 B2 * | | 11/2011 | Samuelson ............ B82Y 10/00 257/13 |
| 8,772,770 B2 * | | 7/2014 | Asami et al. .................... 257/43 |
| 2009/0165854 A1 * | | 7/2009 | Yamazaki et al. ............ 136/258 |
| 2010/0148324 A1 * | | 6/2010 | Chen .................. H01L 27/2418 257/656 |
| 2011/0297913 A1 * | | 12/2011 | Kim et al. ........................ 257/9 |
| 2012/0043587 A1 * | | 2/2012 | Takahashi ........... H01L 21/8252 257/194 |
| 2012/0153355 A1 * | | 6/2012 | Umeda et al. ................. 257/192 |
| 2012/0241759 A1 * | | 9/2012 | Matsunaga et al. ............ 257/76 |
| 2014/0001490 A1 * | | 1/2014 | Konstantinov .................. 257/77 |

FOREIGN PATENT DOCUMENTS

| | | |
|---|---|---|
| KR | 1995-0021729 A | 7/1995 |
| KR | 2005-0065028 A | 6/2005 |
| KR | 1105250 B1 | 1/2012 |

\* cited by examiner

*Primary Examiner* — Fernando L Toledo
*Assistant Examiner* — Neil Prasad
(74) *Attorney, Agent, or Firm* — Lathrop & Gage LLP (57) ABSTRACT

Disclosed herein are a rectifying device and a method of fabricating the same. The rectifying device includes a first electrode formed in a flat shape, an insulating layer deposited on the first electrode and a second electrode formed on a preset region of the insulating layer in a nanaopillar shape in a longitudinal direction to be asymmetrical to the first electrode, thereby increasing current flow.

11 Claims, 7 Drawing Sheets

RECTIFYING DEVICE AND METHOD FOR MANUFACTURING THE SAME

CROSS-REFERENCES TO RELATED APPLICATION

This patent application claims the benefit of priority from Korean Patent Application No. 10-2013-0057073, filed on May 21, 2013, the contents of which are incorporated herein by reference.

BACKGROUND OF THE INVENTION

1. Field of the Invention

The present disclosure relates to a rectifying device and a method for manufacturing the same, and more particulary, to an asymmetric rectifying device and a method for manufacturing the same.

2. Description of the Related Art

As a rectifying device having a rectifying property, there is a silicon or germanium diode using a p-n junction of a semiconductor, or a selenium rectifier or a copper oxide rectifier using the contact surface of the metal and the semiconductor. For example, there is a tunnel diode, etc.

Since the tunnel diode was invented by Esaki Leona, it has continuously received attention for half a century.

The tunnel diode is preferable for maintaining any switching state such as an open/closed state in many application fields, and a function of the tunnel diode is based on an interband tunneling of charge carriers.

For example, a tunnel diode is disclosed in Korean Patent Publication No. 1995-0021729 entitled "tunnel diode and memory device". In this tunnel diode, an insulating dielectric material is inserted between two conductive metal electrodes, forms a barrier having a barrier level for electrons and has a ferroelectric material layer at room temperature, in the tunnel diode having a degree of thickness such that electrons can tunnel through the barrier from one electrode to the other electrode at a voltage higher than a threshold voltage, and a current polarization of the dielectric material has a property in that it may vary the barrier level.

Also, a stacked solar cell having a tunnel diode layer is disclosed in Korean Patent Publication No. 2005-0065028 entitled "stacked solar cell having tunnel diode layer". This stacked solar cell having the tunnel diode layer is configured to include a GaAlAs upper cell having a window layer on an upper surface on which light is incident, a GaAs lower cell to which a carrier generated in the GaAlAs upper cell transfers and a tunnel diode installed between the GaAlAs upper cell and the GaAs lower cell.

Further, a solar cell having a p-n tunnel diode is disclosed in Korean Patent No. 10-1105250 entitled "solar cell having p-n tunnel diode". The solar cell having the p-n tunnel diode includes an n-type substrate, a p-n tunnel diode formed on the n-type substrate in which an n-type semiconductor and a p-type semiconductor are sequentially stacked to form a p-n junction, a photoelectric conversion cell formed on the p-n tunnel diode wherein the n-type semiconductor and the p-type semiconductor are sequentially stacked to convert a photo signal to a electrical signal, a lower electrode formed on a lower portion of the n-type substrate and an upper electrode formed on the photoelectric conversion cell, wherein the lower electrode and the upper electrode are n-ohmic contact electrodes.

In the tunnel diode such as that in this embodiment, when a voltage is applied across the junction and the tunnel diode is forward biased, as the voltage increases up to a peak voltage, a current increases up to a peak current, and if the voltage further increases up to a valley voltage, the current decreases up to a valley current.

However, the tunnel diode is considered to have a potential equal to a transistor, but does not actually have the potential in actual applications.

Using the tunnel diode has many potential advantages in many applications, but may limit application diversity because of insufficient performance due to the technical limits of a fabrication and a driving mechanism. Due to recent increases in data volume and communication frequencies, the development of a tunnel diode capable of operating in ultrahigh frequencies is required.

SUMMARY OF THE INVENTION

A rectifying device according to an embodiment of the present invention includes a first electrode formed in a flat shape, an insulating layer deposited on the first electrode and a second electrode formed on a preset region of the insulating layer in a different shape from the first electrode in a longitudinal direction to be asymmetrical to the first electrode, thereby increasing current flow.

Also, the first electrode is formed of any one of a metal, a semiconductor or a graphene.

Further, the second electrode 30 is formed of any one of a nanotube or a nanowire having an aspect ratio of 200:1 to 2000:1.

Furthermore, the nanotube is formed of any one of a carbon nanotube, a metallic nanotube and a semiconductive nanotube, wherein a cross-section of the nanotube is any one of a ring shape, a square, a rectangul and an oval.

Also, the nanowire is formed of any one of a metallic nanowire or a semiconductive nanowire, wherein a cross-section of the nanowire is any one of a ring shape, a square, a rectangul and an oval.

Meanwhile, a method of fabricating a rectifying device according to an embodiment includes a step of forming a first electrode having a flat shape, a step of forming a insulating layer on the first electrode and a step of forming a second electrode layer having a different shape from the first electrode in a longitudinal direction on a preset region of the insulating layer.

A rectifying device according to another embodiment of the present invention includes a first electrode and a contact electrode spaced a predetermined distance apart from each other on a substrate and a second electrode spaced apart from the first electrode, and connected to the contact electrode, wherein the first electrode is a flat shape and the second electrode is formed on a preset region of the insulating layer in a different shape from the first electrode in a longitudinal direction, so that the first electrode and the second electrode are asymmetrical to each other.

A rectifying device according to a further embodiment of the present invention includes a first electrode and a contact electrode spaced a predetermined distance apart from each other on a substrate, a second electrode spaced apart from the first electrode and connected to the contact electrode and an insulating layer formed to surround a part of each of the first electrode and the second electrode including a region in which the first electrode and the second electrode are spaced apart from each other, wherein the first electrode is of a flat shape, and the second electrode is formed on a preset region of the insulating layer in a different shape from the first electrode in a longitudinal direction, so that the first electrode and the second electrode are asymmetrical to each other.

BREIF DESCRIPTION OF THE DRAWINGS

The above and other objects, features and other advantages of the present invention will be more clearly understood from the following detailed description taken in conjunction with the accompanying drawings, in which:

FIGS. 4a to 4l are views illustrating a method of fabricating a tunnel diode according to first and second embodiments;

DESCRIPTION OF THE PREFERRED EMBODIMENTS

Hereinafter, a preferred embodiment of the present invention will be described in detail with the reference to the accompanying drawings.

Figure 1:
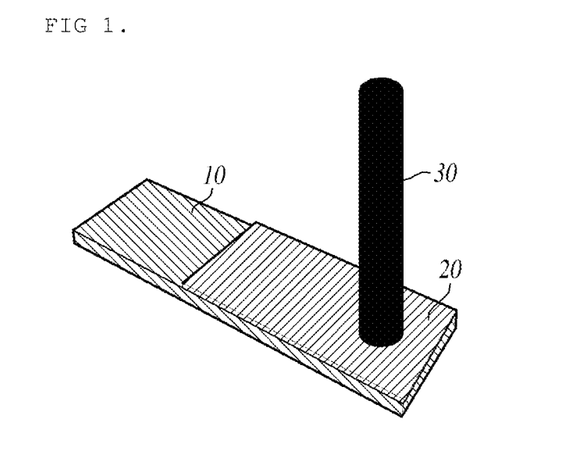
FIG. 1 is a view illustrating a tunnel diode according to a first embodiment.
Figure 2:
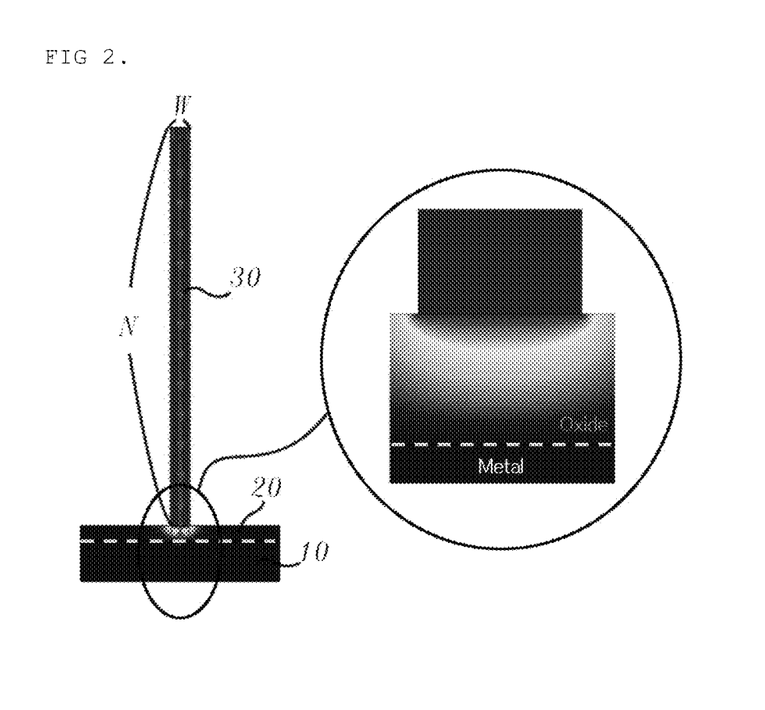
FIG. 2 is a cross-sectional view illustrating a tunnel diode according to a first embodiment.
Figure 3:
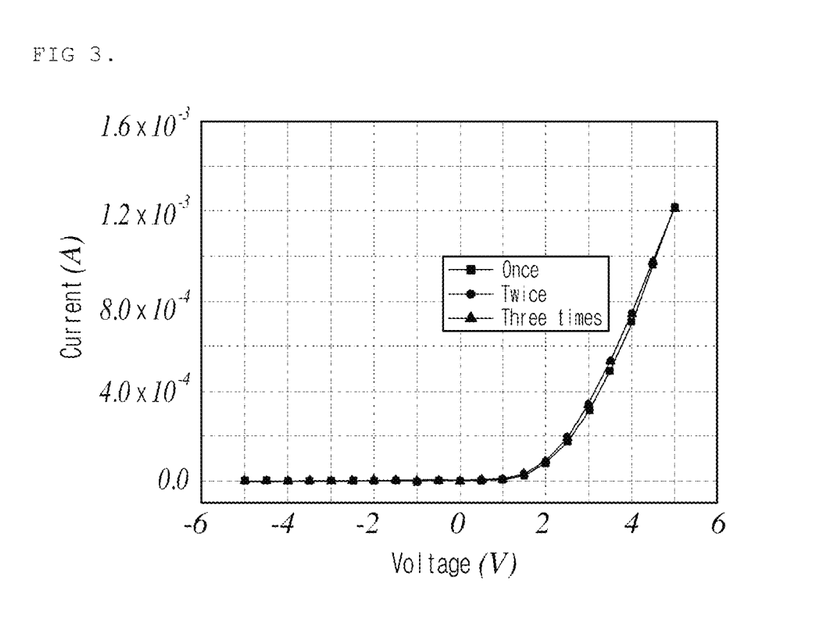
FIG. 3 is a graph showing a current flow increase as a result of operating a tunnel diode one to three times according to a first emebodiment.
Figure 4A:
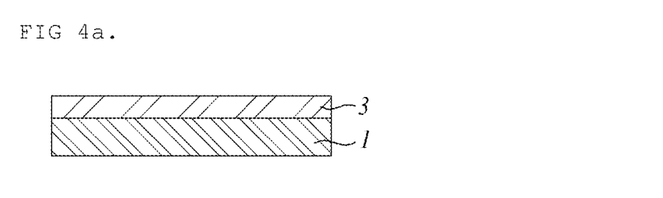
Figure 4B:
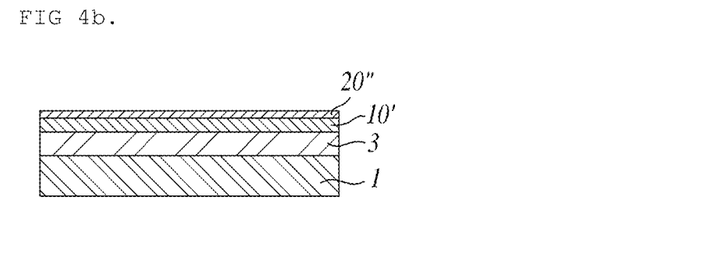
Figure 4C:
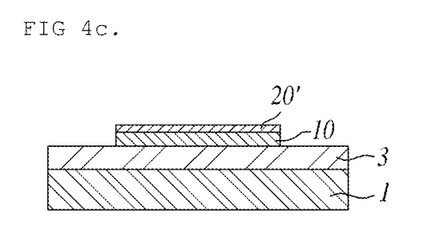
Figure 4D:
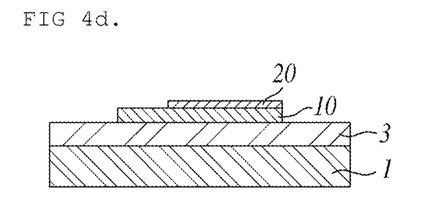
Figure 4E:
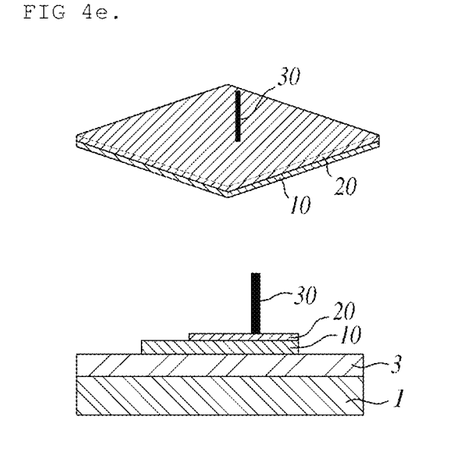
Figure 4F:
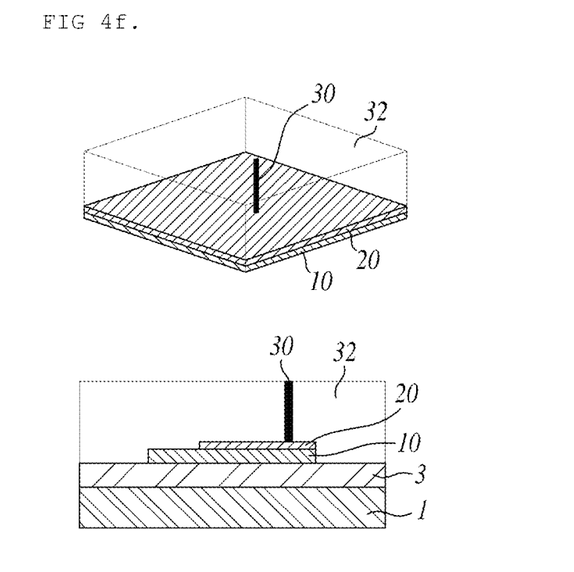
Figure 4G:
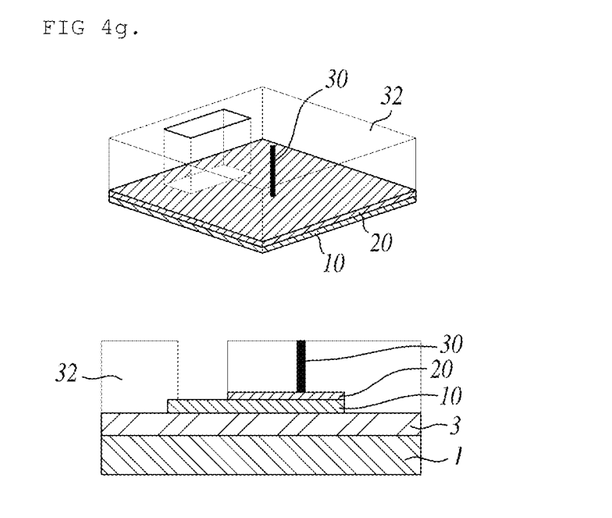
Figure 4H:
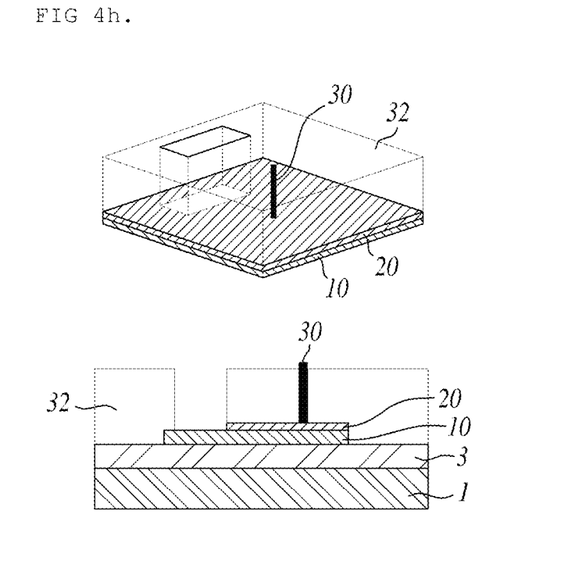
Figure 4I:
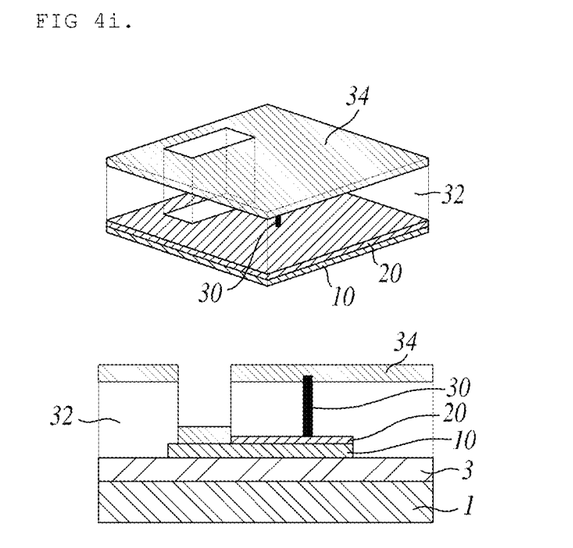
Figure 4J:
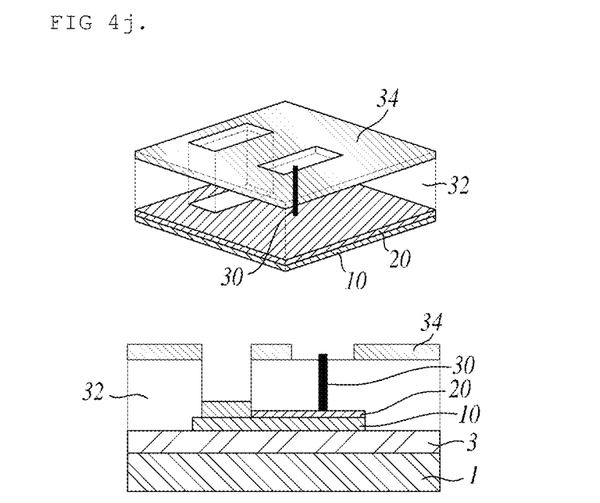
Figure 4K:
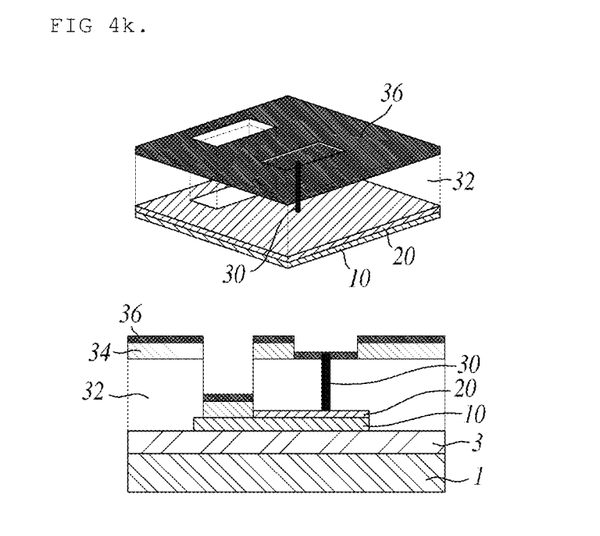

FIG. 1 is a view illustrating a tunnel diode according to a first embodiment, FIG. 2 is a cross-sectional view illustrating a tunnel diode according to a first embodiment. Also, FIG. 3 is a graph showing a current flow increase as a result of operating a tunnel diode one to three times according to a first emebodiment.

As shown in FIGS. 1 and 2, a tunnel diode according to a first embodiment includes a first electrode 10, an insulating layer 20 deposited on the first electrode 10, a second electrode 30 growing in a nano size on the insulating layer 20 and formed asymmetrically to the first electrode 10. The asymetrical structure means a structure relating to the second electode 30 formed in a longitudinal direction pillar shape on the first electrode 10 that is formed in a flat electrode. Also, the second electrode 30 is preferably formed to be perpendicular to the insulating layer 20.

Here, conductive materials such as a metal, a semiconductor, a graphene or the like may be used in the first electrode 10.

The second electrode 20 is formed of a naonotube or a nanowire having a high aspect ratio (height to width) of at least 200:1 to 2000:1.

A carbon nanotube, a metal nanotube, a semiconductive nanotube or the like my be used in the nanotube.

A metal nanowire, a semiconductive nanowire or the like may be used in the nanowire.

The nanotube or the nanowire is in a rod-like shape having two orthogonal cross-sectional dimensions less than 5 nm to 500 nm at any point along a longitudinal direction. A cross-section of the nanotube or the nanowire includes a ring shape, a square, a rectangle or an oval, but is not limited to these shapes and on the contrary, may have any shape. The cross-section of the nanotube or the nanowire may have a regular or irregular shape.

As shown in FIGS. 2 and 3, the tunnel diode according to the first embodiment including the second electrode 30 formed of the nanotube or the nanowire and formed asymmetrically to the first electrode 10 may increase a current flow because a strong electric field can be applied at the same voltage to lower a tunneling barrier, through a field effect tunneling property using the asymmetric structure, that is, the high aspect ratio of the nanotube or the nanowire as well as a work function difference according to differences in materials.

A tunneling rate of the tunnel diode is inversely exponential to a barrier height, and a barier thickness formed by a bandgap between a conduction band and a valence band. The thickness is provided by the width of a depletion region and by a doping concentration of a material. Also, the mass of electrons and holes is important for the tunneling rate.

At the point of zero voltage, a junction functions as an ohmic resistance, and the resistance in this analogue is inversely proportional to the tunneling rate. At the point of peak voltage, the voltage applied across the junction induces a maximum overlap between free electrons in the conduction band and free holes in the valence band at the same energies. At this point, the current is a maximum value, and in this state, when the voltage further increases, the current decreases. This means that the junction indicates a negative differential resistance. However, when the much higher voltage is applied, the tunnel diode reaches a forward biased normal diode state, and at this time, as the voltage increases, the current increases.

Thus, as shown in the following equation, in the tunnel diode according to the first embodiment, the second electrode is formed of the nanotube or the nanowire, formed asymmetrically to the first electrode 10 and makes contact with the insulating layer 20. Therefore, because of the asymmetrical structure such as β as well as a work function according to a difference in materials such as φ at the same voltage such as $E_F$, a strong electric field may be applied to lower a tunneling barrier, thereby increasing a current flow.

$$PE_{C \rightarrow O}(x) = (E_F + \Phi) - \frac{e^2}{16\pi\varepsilon_0 x} - \beta exE$$

Here, the PE is a potential energy, the $E_F$ is a fermi level energy, the φ is a work function, the $\varepsilon_0$ is an absolute dielectric constant, the β is a distance from one end of the second electrode 30 contacting an insulating layer 20 to the other end of the second electrode 30 facing the one end, and the E is an electric field.

Hereinafter, a method of fabricating a tunnel diode according to a first embodiment will be described.

FIGS. 4a to 4e are views illustrating the method of fabricating the tunnel diode according to the first embodiment. Referring to 4a to 4e, in the tunnel diode according to the first embodiment, a silicon oxide ($SiO_2$) layer 3 is deposited on a substrate.

Also, a first conductive layer 10' and an insulating layer 20" are sequently deposited on the silicon oxide layer 3, and then the first conductive layer 10' and the insulating layer 20 are etched using a photolithographic process. Here, a first electrode 10 on which the tunnel diode is to be formed is formed by selectively etching the first conductive layer 10' and the insulating layer 20".

Furthemore, the insulating layer 20 is formed by selectively etching the insulating layer 20'.

A second electrode 30 is formed on the insulating layer 20. The second electrode 30 may be formed in a longitudinal direction using an epitaxial process.

In more detail, the second electrode 30 is formed of an upright nanotube or nanowire having a high aspect ratio (height to width) of at least 200:1 to 2000:1.

Therefore, the first electrode 10 formed in a flat shape and the second electrode 30 formed in a different shape from the first electrode 10 in a longitudinal direction are asymmetrical to each other.

Also, the nanowire may grow in a different manner from a manner described herein.

Herinafter, a method of fabricating a tunnel diode according to a second embodiment will be described.

When the processes of FIGS. 4f to 4l are performed after the processes of FIGS. 4a to 4e, FIGS. 4f to 4l are views illustrating the method of fabricating the tunnel diode according to the second embodiment. An interlayer insulating film 32 is deposited on an entire surface including the second electrode 30. After that, regions of the interlayer insulating film 32 and the insulating layer 20 to which the first electrode (10) is electrically connected are selectively etched using a photolithographic process. Here, at least in part of the first electrode 10 is exposed by selectively etching the interlayer insulating film 32.

Further, the interlayer insulating film 32 on the second electrode 30 is etched so that the second electrode 30 is exposed. And then, a bake process is performed on the entire surface including the exposed second electrode 30.

After the bake process is performed, a second photoresist layer 34 is applied on the entire surface including the second electrode 30. The second photoresist layer 34 may be applied at a uniform height. Also, the second photoresist layer 34 is selectively exposed and developed so that the interlayer insulating film 32 of a region on which a contact electrode 40 electrically contacted to the second electrode 30 is to be formed is exposed.

A second conductive layer 36 for forming the contact electrode 40 electrically connected to the second electrode 30 is deposited on the entire surface including the second photoresist film 34. The second photoresist film 34 is removed using a lift-off process to form a contact electrode 40.

Here, the contact electrode 40 is supported by the interlayer insulating film 32, thereby enabling the contact electrode 40 to be electrically contacted to the second electrode 30 more easily than being directly electrically connected to the second electrode 30.

Furthermore, in the tunnel diodes according to the first and the second embodiments, a tunneling phenomenon may occur between the first electrode 10 and the second electrode 30. That is, the tunneling phenomeon may occur between the first electrode 10 and the second electrode 30 with the insulating layer 20 in-between.

Hereinafter, a tunnel diode according to a third embodiment will be described.

Figure 5:
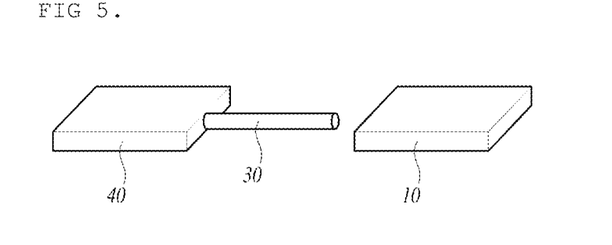
FIG. 5 is a view illustrating a tunnel diode according to a third embodiment.

FIG. 5 is a view illustrating the tunnel diode according to the third embodiment.

Referring to FIG. 5, the tunnel diode according to the third embodiment includes a first electrode 10 and a contact electrode 40 spaced a predetermined distance apart from each other on a substrate (not shown) on which a silicon oxide layer is formed (not shown) and a second electrode 30 spaced apart from the first electrode 10, connected to the contact electrode 40 and being asymmetrical.

Here, the symmetrical structure means a structure relating the second electrode 30 formed in a relative longitudinal direction in a nanopillar shape on the first electrode 10 formed in a flat shape. Furthermore, the second electrode 30 is preferably formed perpendicular to the first electrode 10 and the contact electrode 40.

In more detail, the first electrode 10 and the contact electrode 40 is spaced apart from each other—for example, each of a left surface of the first electrode 10 and a right surface of the contact electrode 40 may be a facing surface in FIG. 5. In this case, the second electrode 30 may be formed perpendicular to the right surface of the first electrode which is the facing surface and formed perpendicular to the left surface of the contact electrode 40.

Furthermore, the second electrode 30 is surrounded by air or a vacuum instead of the insulating layer 20 of the tunnel diode according to the first embodiment. That is, the tunneling phenomeon may occur between the first electrode 10 and the second electrode 30 with the air or the vacuum in-between.

Hereinafter, a tunnel diode according to a fourth embodiment will be described.

Figure 6:
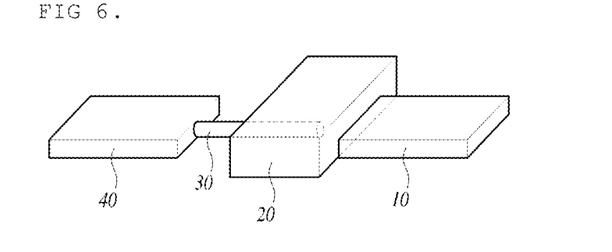
FIG. 6 is a view illustrating a tunnel diode according to a fourth embodiment.

FIG. 6 is a view illustrating the tunnel diode according to the fourth embodiment.

Referring to FIG. 6, the tunnel diode according to the fourth embodiment includes a first electrode 10 and a contact electrode 40 spaced a predetermined distance apart from each other on a substrate (not shown) on which a silicon oxide layer is formed (not shown) and a second second electrode 30 spaced apart from the first electrode 10, connected to the contact electrode 40 and being asymmetrical.

Here, the asymmetrical structure means a structure relating to the second electrode 30 formed in a relative longitudinal direction in a nanopillar shape on the first electrode 10 formed in a flat shape. Furthermore, the second electrode 30 is preferably formed perpendicular to the first electrode 10 and the contact electrode 40.

In more detail, the first electrode 10 and the contact electrode 40 are spaced apart from each other—for example, each of a left surface of the first electrode 10 and a right surface of the contact electrode 40 may be a facing surface in FIG. 6. In this case, the second electrode 30 may be formed perpendicular to the right surface of the first electrode which is the facing surface and formed perpendicular to the left surface of the contact electrode 40.

Furthermore, the insulating layer 20 of the tunnel diode according to the first embodiment is formed in order to surround a part of each of the first electrode 10 and the second electrode 30 including a region where the first electrode 10 and the second electerode 30 are spaced apart from each other. That is, the tunneling phenomeon may occur between the first electrode 10 and the second electrode 30 with the insulating layer 20 in-between.

As described above, in a rectifying device and a method for manufacturing the same according to the present invention, one electrode is formed of a nanotube or a nanowire so that a tunnel diode is an asymmetrical structure, and thus a current flow may increase because a strong electric field can be applied at the same voltage in a high aspect ratio of the nanotube or the nanowire to lower a tunneling barrier using a property of field effect tunneling using an asymmetrical structure as well as a work function difference according to differences in materials—that is, a high aspect ratio of the nanotube or the nanowire.

In the rectifying device and the method of fabricating the same according to the present invention, since one electrode is formed of a nanotube or a nanowire so that a tunnel diode is asymmetrical, the tunnel diode may operate in a super high frequency by rectifying a current due to the asymmetrical structure as well as a work function difference according to differences in materials.

The object of the present invention is not limited to the aforesaid, and other objects not described herein will be clearly understood by those skilled in the art from descriptions below.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, each of elements shown in embodiments may be modified and carried out. Also, all differences relating to the modifications, additions and substitutions will be construed as being included in the present invention.

What is claimed is:

1. A rectifying device comprising:
   a first electrode formed in a flat shape;
   an insulating layer deposited on the first electrode and contacting the first electrode; and
   a second electrode, spaced apart from the first electrode, formed in a longitudinal direction on a preset region of the insulating layer and contacting the insulating layer in a different shape from the first electrode to be asymmetrical to the first electrode, to increase current flow;
   wherein a height of the second electrode is greater than a width of the second electrode; and
   wherein the second electrode is a nanotube or nanowire having an aspect ratio selected from the range of 200:1 to 2000:1.

2. The rectifying device of claim 1, wherein the first electrode is formed of any one of a metal, a semiconductor or a graphene.

3. The rectifying device of claim 1, the second electrode being the nanotube, the nanotube comprising any one of a carbon nanotube, a metallic nanotube and a semiconductive nanotube, wherein a cross-section of the nanotube is any one of a ring shape, a square shape, a rectangular shape and an oval shape.

4. The rectifying device of claim 1, the second electrode being the nanowire, the nanowire comprising any one of a metallic nanowire or a semiconductive nanowire, wherein a cross-section of the nanowire is any one of a ring shape, a square shape, a rectangular shape and an oval shape.

5. A rectifying device comprising:
   a first electrode and a contact electrode spaced a predetermined distance apart from each other on a substrate;
   an insulating layer deposited on said first electrode and contacting the first electrode; and
   a second electrode spaced apart from the first electrode and connected to the contact electrode and contacting the insulating layer,
   wherein the first electrode is of a flat shape, and the second electrode is formed extending in a longitudinal direction from the contact electrode towards the first electrode and in a different shape from the first electrode, so that the first electrode and the second electrode are asymmetrical to each other;
   wherein a height of the second electrode is greater than a width of the second electrode, and
   wherein the second electrode is a nanotube or nanowire having an aspect ratio selected from the range of 200:1 to 2000:1.

6. A method of fabricating a rectifying device, the method comprising:
   a step of forming a first electrode having a flat shape;
   a step of forming an insulating layer on the first electrode, wherein said insulating layer is in contact with the first electrode; and
   a step of forming a second electrode, spaced apart from the first electrode, having a different shape from the first electrode in a longitudinal direction on a preset region of the insulating layer, wherein the second electrode is in contact with the first insulating layer,
   wherein a height of the second electrode is greater than a width of the second electrode, and
   wherein the second electrode is a nanotube or nanowire having an aspect ratio selected from the range of 200:1 to 2000:1.

7. The rectifying device of claim 1, wherein the second electrode extends from the insulating layer away from the first electrode in the longitudinal direction having a pillar shape.

8. The rectifying device of claim 1, wherein the insulating layer is deposited directly on the first electrode, and wherein the second electrode is formed directly on the insulating layer.

9. The rectifying device of claim 5, the first electrode having a first surface that faces a second surface of the contact electrode, wherein the second electrode extends from the second surface towards the first surface.

10. The rectifying device of claim 5, wherein the second electrode is surrounded by air or a vacuum.

11. A rectifying device consisting of:
    a first electrode formed in a flat shape;
    an insulating layer deposited on the first electrode and contacting the first electrode; and
    a second electrode, spaced apart from the first electrode, formed in a longitudinal direction on a preset region of the insulating layer and contacting the insulating layer in a different shape than the first electrode and to be asymmetrical to the first electrode to increase current flow,
    wherein a height of the second electrode is greater than a width of the second electrode, and
    wherein the second electrode is a nanotube or nanowire having an aspect ratio selected from the range of 200:1 to 2000:1.

* * * * *